United States Patent
Zhao et al.

(10) Patent No.: US 8,957,657 B2
(45) Date of Patent: Feb. 17, 2015

(54) STARTUP OF DC-DC CONVERTERS UTILIZING MULTIPLE POWER SEGMENTS

(71) Applicant: Fairchild Semiconductor Corporation, San Jose, CA (US)

(72) Inventors: Bin Zhao, Irvine, CA (US); Victor Lee, Irvine, CA (US)

(73) Assignee: Fairchild Semiconductor Corporation, San Jose, CA (US)

( * ) Notice: Subject to any disclaimer, the term of this patent is extended or adjusted under 35 U.S.C. 154(b) by 222 days.

(21) Appl. No.: 13/621,380

(22) Filed: Sep. 17, 2012

(65) Prior Publication Data
US 2013/0249519 A1    Sep. 26, 2013

Related U.S. Application Data

(60) Provisional application No. 61/535,925, filed on Sep. 16, 2011.

(51) Int. Cl.
  *G05F 1/56* (2006.01)
  *G05F 1/46* (2006.01)

(52) U.S. Cl.
  CPC .................................. *G05F 1/46* (2013.01)
  USPC ................................... 323/284; 323/288

(58) Field of Classification Search
  USPC .................... 323/238, 266, 282–290
  See application file for complete search history.

(56) References Cited

U.S. PATENT DOCUMENTS

| | | | |
|---|---|---|---|
| 6,969,977 B1 | 11/2005 | Smith | |
| 7,782,038 B2 | 8/2010 | Klein | |
| 8,598,800 B2 * | 12/2013 | Uchimoto et al. | 315/247 |
| 2008/0030178 A1 * | 2/2008 | Leonard et al. | 323/282 |
| 2008/0106243 A1 * | 5/2008 | Cheon et al. | 323/238 |
| 2008/0265849 A1 * | 10/2008 | Lee | 323/238 |
| 2009/0128112 A1 * | 5/2009 | Xu et al. | 323/282 |
| 2010/0157629 A1 * | 6/2010 | Yoshikawa | 363/21.01 |
| 2010/0309697 A1 * | 12/2010 | Werle et al. | 363/126 |
| 2012/0049772 A1 * | 3/2012 | Moussaoui et al. | 318/376 |
| 2012/0153921 A1 * | 6/2012 | Brokaw | 323/288 |
| 2012/0326689 A1 * | 12/2012 | Rice | 323/284 |
| 2013/0021009 A1 * | 1/2013 | Waltman et al. | 323/271 |
| 2013/0063984 A1 * | 3/2013 | Sandner et al. | 363/20 |
| 2013/0135905 A1 * | 5/2013 | Yeh | 363/21.01 |

* cited by examiner

*Primary Examiner* — Adolf Berhane
*Assistant Examiner* — Nusrat Quddus
(74) *Attorney, Agent, or Firm* — Grossman Tucker Perreault & Pfleger PLLC (57) ABSTRACT

Generally, this disclosure provides methods and systems for improved startup for DC-DC converters that reduce input voltage droop, in-rush current and output voltage jumps. The system may include a power stage circuitry including a plurality of power segments coupled in parallel, the power stage circuitry is coupled between an input voltage and output stage circuitry and configured to deliver power to a load coupled to the output stage circuitry. The system may further include PWM and power stage controller circuitry configured to sequentially and progressively activate the plurality of power segments to limit an input in-rush current from the input voltage during a ramp up period and output voltage at the output stage circuitry.

18 Claims, 6 Drawing Sheets

STARTUP OF DC-DC CONVERTERS UTILIZING MULTIPLE POWER SEGMENTS

CROSS REFERENCE TO RELATED APPLICATIONS

This application claims the benefit of U.S. Provisional Application No. 61/535,925 filed Sep. 16, 2011, which is incorporated by reference herein in its entirety.

FIELD

The present disclosure relates to improved startup for DC-DC converters, and, more particularly, to DC-DC converter topologies that reduce input voltage droop and in-rush current.

BACKGROUND

To reduce system in-rush current, conventional power supplies may employ so-called "soft-start" techniques to gradually bring the output voltage up to a nominal level. In some DC-DC converters, a control loop with feedback from the output voltage is used for output voltage regulation in normal operation as well as during startup. Typically, an error comparator is used for such purposes, where the feedback voltage is compared to a reference voltage (and the reference voltage ramps up to some prescribed level). The output of the error comparator may be used, for example, to set the duty cycle of the DC-DC converter switches. However, due to component variation and limitations on the input voltage range of the error comparator, low values of feedback voltage and ramp reference voltage during startup may cause significant input voltage droop, input surge current and output voltage jumps. Such events may trigger system shutdown and/or loss of functionality or performance of various system components. In addition, output voltage jumps may trigger ESD protection circuits, which could result in system malfunction and/or damage.

BRIEF DESCRIPTION OF DRAWINGS

Features and advantages of the claimed subject matter will be apparent from the following detailed description of embodiments consistent therewith, which description should be considered with reference to the accompanying drawings, wherein:

Although the following Detailed Description will proceed with reference being made to illustrative embodiments, many alternatives, modifications, and variations thereof will be apparent to those skilled in the art.

DETAILED DESCRIPTION

Generally, this disclosure describes a DC-DC converter system that improves startup characteristics to reduce, for example, input voltage droop, in-rush current and output voltage jumps during startup conditions. The DC-DC converter includes multiple power segments that may be dynamically and independently controlled to provide varying levels of current (and hence voltage) to the output during startup. Control logic is also provided to control the power segments to avoid large in-rush current, input voltage droop and/or an output voltage jump. In some embodiments, each of the power segments of the power stage includes FET switch circuitry that can be turned on (conducting) independently and sequentially/progressively as the output voltage controllably ramps up to a desired or nominal level.

Figure 1:
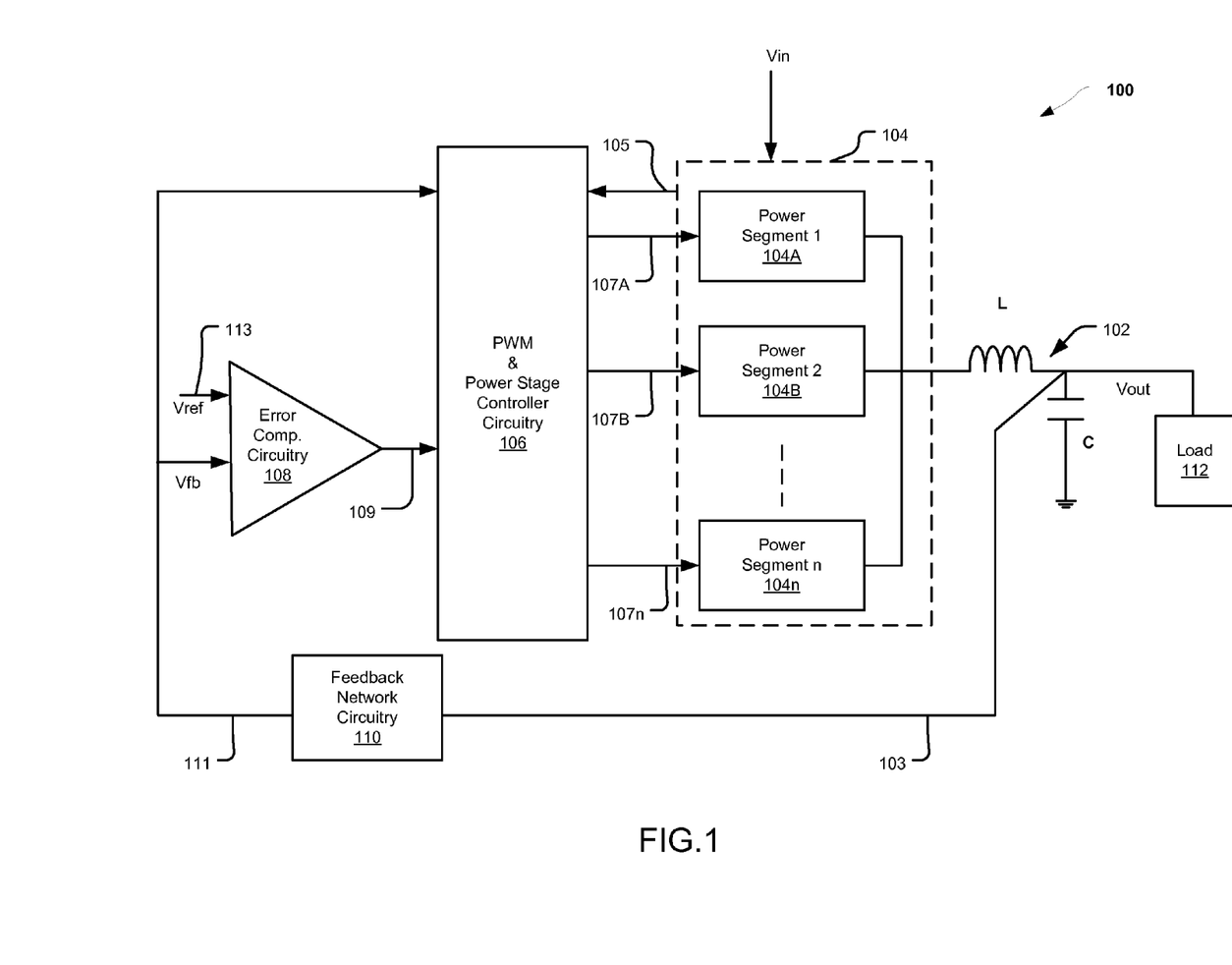
FIG. 1 illustrates a DC-DC converter system consistent with various embodiments of the present disclosure.

FIG. 1 illustrates a DC-DC converter system 100 consistent with various embodiments of the present disclosure. The DC-DC converter system 100 depicted in FIG. 1 may be included with, or form part of, a general-purpose or custom integrated circuit (IC) such as a semiconductor integrated circuit chip, system on chip (SoC), etc. The DC-DC converter system 100 may include various known switched converter topologies such as Buck, Boost, Buck-Boost, Sepic, Flyback, Class B, etc., and/or other known or after-developed DC-DC converter topologies, and is generally configure to receive an input voltage, Vin, and generate an output voltage, Vout, to supply power to a load 112.

The power supply system 100 generally includes an output stage 102 that includes, for example, inductor (L) and capacitor (C) circuitry as may be utilized in one of the aforementioned DC-DC converter topologies. The power supply system 100 also includes power stage circuitry 104 that includes a plurality of power segments, i.e., power segment 1 104A, power segment 2 104B, . . . , power segment n 104n, and pulse width modulation (PWM) and power stage controller circuitry 106 that is configured to control the power stage circuitry 104, as will be described in greater detail below. A feedback arrangement is provided that includes feedback network circuitry 110 configured to generate a voltage feedback signal, Vfb 111, from the output voltage (Vout at node 103), and error comparator circuitry 108 configured to compare the voltage feedback signal 111 with a reference signal 113 to generate a feedback control signal 109. The control signal 109 is provided to PWM and power stage controller 106 to generate the PWM control signals (107A-107n) such that Vfb is closely following Vref.

As a general overview, the power stage circuitry 104 may be configured to operate as a switched DC-DC converter (e.g., Buck converter), and power segments 104A-104(n-1) are configured as the "high side" switches, and power segment 104n is configured as a "low side" switch. As is known, a conventional switched DC-DC converter includes a single "high side" switch and a single "low side" switch. These switches must have the power handling capability (i.e., "size") for the designated voltage/current requirement of the load 112. In contrast, in the present disclosure, the "size" of the high side power segments 104A-104(n-1) may be advantageously smaller. To reduce or eliminate uncontrolled in-rush current, input voltage droop and/or an output voltage jumps, PWM and power stage controller circuitry 106 is configured to sequentially and progressively activate power segments 104A-104(n-1) while Vout is ramped up to a desired or nominal value. PWM and power stage controller circuitry 106 is configured to generate a plurality of PWM control signals 107A, 107B, . . . , 107n to control activation/deactivation of respective power segments 104A, 104B, . . . , 104n, based on feedback information receive from the feedback network circuitry and the power stage 104. The duty cycle of the PWM control signals 107A, 107B, . . . , 107n may be controlled based on feedback information, as is well known.

In operation, initially power segments 104A and 104n may be activated as a high side switch and a low side switch, respectively, using control signal 107A and 107n, respectively. This may cause a ramp up in output voltage, but since only one switch is activated for each "side," the power stage 104 operates to limit input current to the load 112. Thus, while power segments 104A and 104n are activated, input voltage droop and output voltage jumps are reduced or eliminated because of the current limiting capabilities to the output. Once the output voltage exceeds a threshold, additional power segment 104B, . . . 104(n-1) may be activated as "high side" switches to continue the ramp up of the output voltage. To that end, power stage circuitry 104 is configured to generate a control signal 105 indicative of reaching a current limit through power segment 104A. While Vout is ramping up, the control signal 105 may remain inactive. If the control signal 105 is active, indicating that current through the power segment 104A is equal to its pre-defined limit value, PWM and power stage controller circuitry 106 is configured to turn off 104A to prevent the current from exceeding the limit. As Vout is ramped up further, PWM and power stage controller circuitry 106 is configured to activate one or more additional power segments 104B, . . . , 104(n-1) (using control signals 107B, . . . , 107(n-1)) to allow Vout to continue to ramp up in a controlled manner. In some embodiments, the power segments 104B, . . . , 104(n-1) may be activated in "blocks" to provide greater control over Vout. These operations will be described in greater detail below.

Figure 2A:
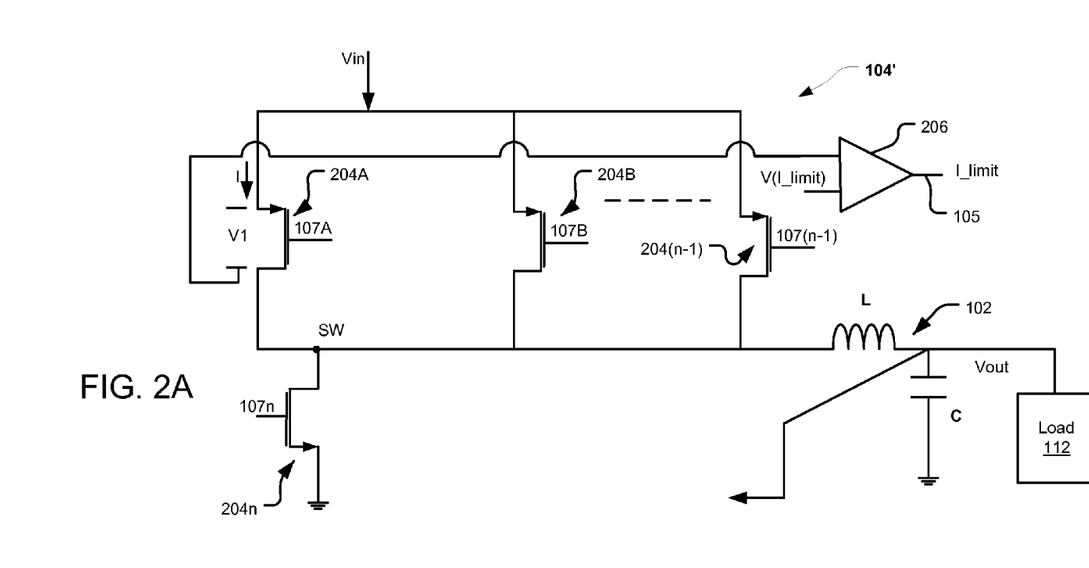
FIG. 2A depicts power stage circuitry consistent with one embodiment of the present disclosure.

FIG. 2A depicts power stage circuitry 104' consistent with one embodiment of the present disclosure. Each of the power segments 204A, 204B, . . . , 204(n-1), in this embodiment, include respective PMOS switches connected in parallel between the input voltage Vin and a switching node SW. Power segment 204n includes an NMOS switch coupled between the switching node SW and a reference node (or ground). The topology depicted in FIG. 2A forms the power switching stage of a Buck DC-DC converter. Comparator circuitry 206 is included to monitor the current through at least one power segment, typically the first power segment 204A. The comparator circuitry 206 may be configured to monitor the current, I, through power segment 204A by monitoring the voltage, V1, across the transistor 204A. The comparator circuitry 206 is configured to compare voltage V1 to a voltage indicative of a desired current limit, V(Ilimit), through the transistor 204A. The output, Ilimit, of the comparator circuitry 206 corresponds to the control signal 105 depicted in FIG. 1. This output 105 is indicative of whether the current, I, through the first transistor 204A is at or below a threshold value I_limit. Thus, for example, if the current, I, is below Ilimit, the output 105 may be a first voltage level (e.g., low), and if the current, I, is approximately equal to Ilimit, the output 105 may be a second voltage level (e.g., high).

In this embodiment, each of the switches 204A-204(n-1) are lower power and/or smaller sized devices. By controlling the number of these devices that are active through the ramp up period of Vout, the switches 204A-204(n-1) operate to limit input in-rush current and reduce or eliminate voltage droop on Vin. Since Vsw=Vin-V1, setting a reference value that is equal to (Vin-V1)$_{max}$, when that reference is met, I$_{max}$ through device 204A is reached. By way of example, assume that R$_{DS\_ON}$ of switch 204A is 100 mOhms. When V1=Vin-Vsw=100 mVolts=100 mOhm×1A, then I=1 amp. If Vin-Vsw is set to 100 mV, then current is limited through switch 204A to 1 amp. Since each of the switches 204A-204(n-1) are coupled in parallel, each switch can be configured to conduct approximately the same current value to Vout if their sizes are the same or substantially the same. If the sizes of the switches are different, the current conducted by each switch can be scaled based on the size. Thus, as additional switches are sequentially activated, the total output current can be increased in a controllable manner to reduce or eliminate input voltage droop and output voltage jumps.

Figure 2B:
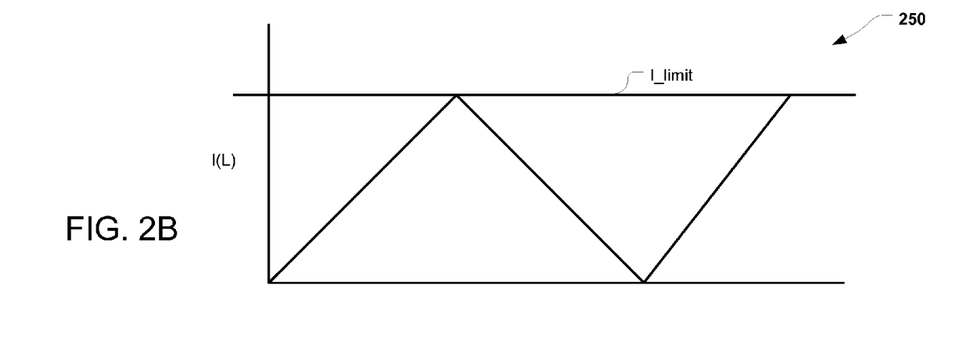
FIG. 2B depicts a signal graph of current through the inductor of the output stage circuitry of FIG. 2A.

FIG. 2B depicts a signal graph 250 of current through the inductor in the output stage circuitry 102. When switch 204A is controlled by PWM signal 107A to conduct, current in the inductor L rises. Once the current reaches the current threshold Ilimit, control signal 105 changes state, and switch 204A is turned off while switch 204n is turned on (conducting).

Figure 3A:
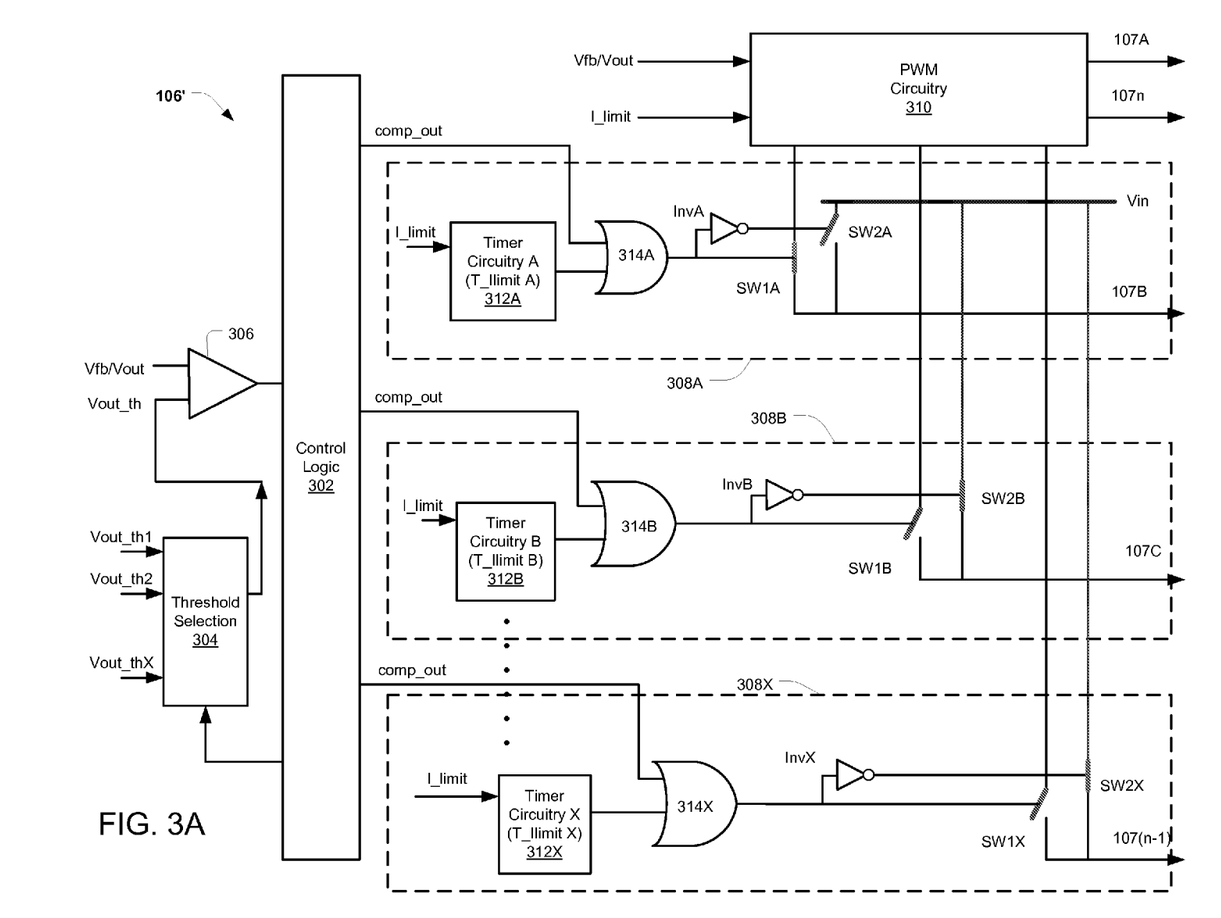
FIG. 3A depicts PWM and power stage controller circuitry consistent with one embodiment of the present disclosure.

FIG. 3A depicts PWM and power stage controller circuitry 106' consistent with one embodiment of the present disclosure. As stated, the power segments of the power stage circuitry 104/104' may be controlled to reduce or eliminate input in-rush current, input voltage droop and output voltage jumps. Accordingly, circuitry 106' is configured to sequentially and progressively activate additional power segments (e.g., 104, 204) during the startup period as Vout ramps up to a desired value. Circuitry 106' includes control logic circuitry 302, output voltage threshold selection circuitry 304, comparator circuitry 306, a plurality of switch gate activation circuitry 308A, 308B, . . . , 308X and PWM circuitry 310.

Figure 3B:
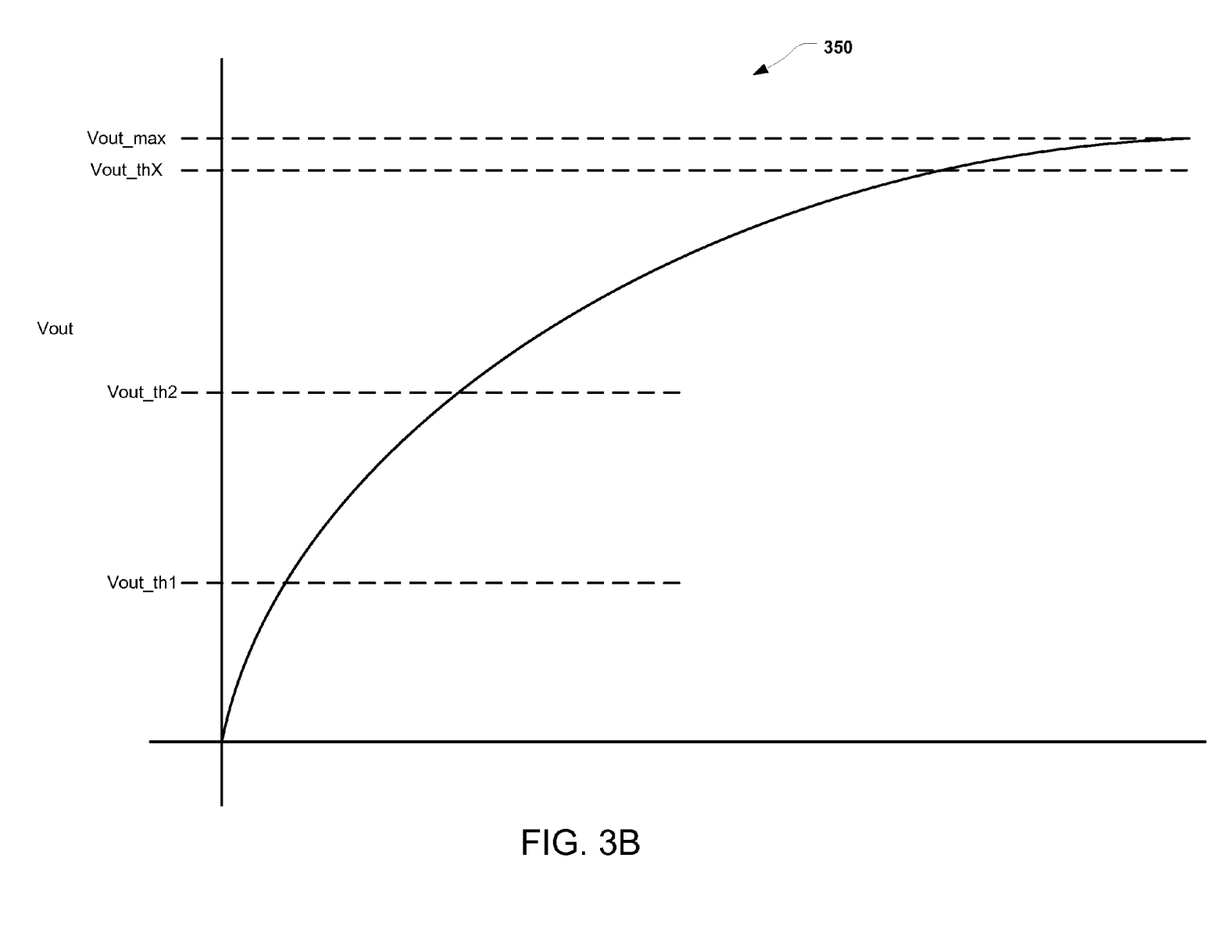
FIG. 3B depicts an example output voltage plot.

The number, X, corresponds to a desired granularity of output control. Referring briefly to FIG. 3B, an example output voltage plot 350 is depicted. Normally, Vout ramps up from 0 Volts to a nominal or maximum desired level, Vout_max. To control Vout during ramp up, a plurality of output voltage threshold values, e.g., Vout_th1, Vout_th2, . . . , Vout_thX may be selected, where each output voltage threshold value has a progressively higher value between 0 volts and Vout_max. As a selected voltage threshold is reached, additional power segments are activated to provide more output current in a controlled manner. Once the Xth threshold is met, all of the power segments may be activated to allow maximum output voltage and current.

The operation of FIG. 3A will be discussed with reference the power stage circuitry 104' of FIG. 2A. Initially, PWM circuitry 310 may activate, via gate control signals 107A and 107n, switches 204A and 204n, and switches 204B, . . . 204(n-1) are held off (nonconducting). Control logic circuitry 302 controls threshold selection circuitry 304 to select the first output voltage threshold value, Vout_th1. Comparator circuitry 306 is configured to compare the output/feedback voltage to a selected one of the output voltage threshold values, and generate a control signal indicative of the comparison between the inputs. Control logic circuitry 302 couples the output of comparator circuitry 306, comp_out, to the input of OR gate 314A. While Vout remains less than Vout_th1, the output of comparator circuitry 306 remains low, and the output of OR gate 314A remains low. The inverter, InvA, generates a high signal, which causes SW2A to conduct, forcing control signal 107B to Vin, thus keeping switch 204B OFF (non conducting). Once Vout ramps up to and/or above Vout_th1, comparator circuitry 306 changes state, and the output of OR gate changes state (to logic high). This causes switch SW1A to conduct (and SW2A to open), and the PWM control signal 107B is now coming from the PWM control circuit 310 and actively controls switch 204B on and off to provide additional current to inductor and the load. Once the output of comparator circuitry 306 changes state for a given output voltage threshold value, control logic circuitry 302 may latch that value as an input to the corresponding of switch gate activation circuitry 308A, 308B, . . . , 308X. At this point, switches 204A and 204B are active in providing output power.

Once the output of comparator 306 changes state as a result of the output voltage reaching or exceeding the first threshold value Vout_th1, the next output voltage threshold value is selected, Vout_th2, and control logic circuitry 302 couples the output of comparator circuitry 306 to the input of OR gate 314B. The process continues for all of the output voltage threshold values until the output voltage ramps up to full, or nominal value.

Output load conditions may vary, which can create instances where the current limiting effects of the power segments may not allow the output voltage to achieve a given output voltage threshold value. Accordingly, in some embodiments, each of the switch gate activation circuitry 308A, 308B, . . . , 308X may include respective timer circuitry 312A, 312B, . . . , 312X. Essentially, the timer circuitry operates to activate an additional power segment once I_limit has been reached for a selected period of time, even if the respective output voltage threshold value has not been reached. Continuing with the previous example, when Vout_th1 is selected, control logic circuitry 302 may enable (via Ilimit, 105) timer circuitry 312A. Once the current through switch 204A reaches Ilimit, timer circuitry 312A is configured to start a timer for a selected time period (T_Ilimit A). Once that time period ends (time out), the output of timer circuitry 312A may change states and input a logic high to OR gate 314A, which activates control signal 107B in a manner described above. Timer circuitry 312A may include latch circuitry (not shown) to latch the output of timer circuitry 312A high once the output has changed state. Operation of timer circuitry 312B, . . . , 312X continues in a similar manner.

It should be noted that although FIG. 3A depicts a one-to-one correspondence between switch gate activation circuitry 308A, 308B, . . . , 308X and gate control signals 107B, 107C, . . . , 107(n-1), in other embodiments each switch gate activation circuitry 308A, 308B, . . . , 308X may be configured to activate a plurality of gate control signals. For example, if power stage circuitry 204 includes 4 switches and there are two output voltage threshold values, initially switch 204A may be activated. Once the first threshold is reached, switch 204B may be activated (using circuitry 308A). Once the second threshold is reached, switches 204C and 204D may be activated (using circuitry 308B). Of course, this is only an example, and the present disclosure equally contemplates any number of power segments and/or output voltage threshold values that may be sequentially activated in any number of ways. Also, it should be noted that the current time limits T_Ilimit A, T_Ilimit B, . . . , T_Ilimit X may be selected to be the same (or substantially the same) or different time values. In addition, the output voltage threshold values Vout_th1, Vout_th2, . . . , Vout_thX and/or the current time limits T_Ilimit A, T_Ilimit B, . . . , T_Ilimit X may be preprogrammed for a given converter/load topology and/or programmable to minimize input in-rush current, voltage droop and output voltage jumps for a given converter/load topology.

In an alternative embodiment, a configuration of one-to-one correspondence between switch gate activation circuitry 308A, 308B, . . . , 308X and gate control signals 107B, 107C, . . . , 107(n-1) can be used, where each power segment (FET or switch) may have a different size.

In another embodiment, the multiple "lower power" power segments (those that are sequentially or progressively activated in the start up process) can be on the low-side. This may be applicable, for example, in a boost converter topology as the current limit is implemented in the low-side.

In another embodiment, the power segment on the other side (in contrast to the side where the power segments are progressively activated in the start up process), the power switch can be replaced by a diode (e.g., non-synchronous buck converters or non-synchronous boost converters).

Figure 4:
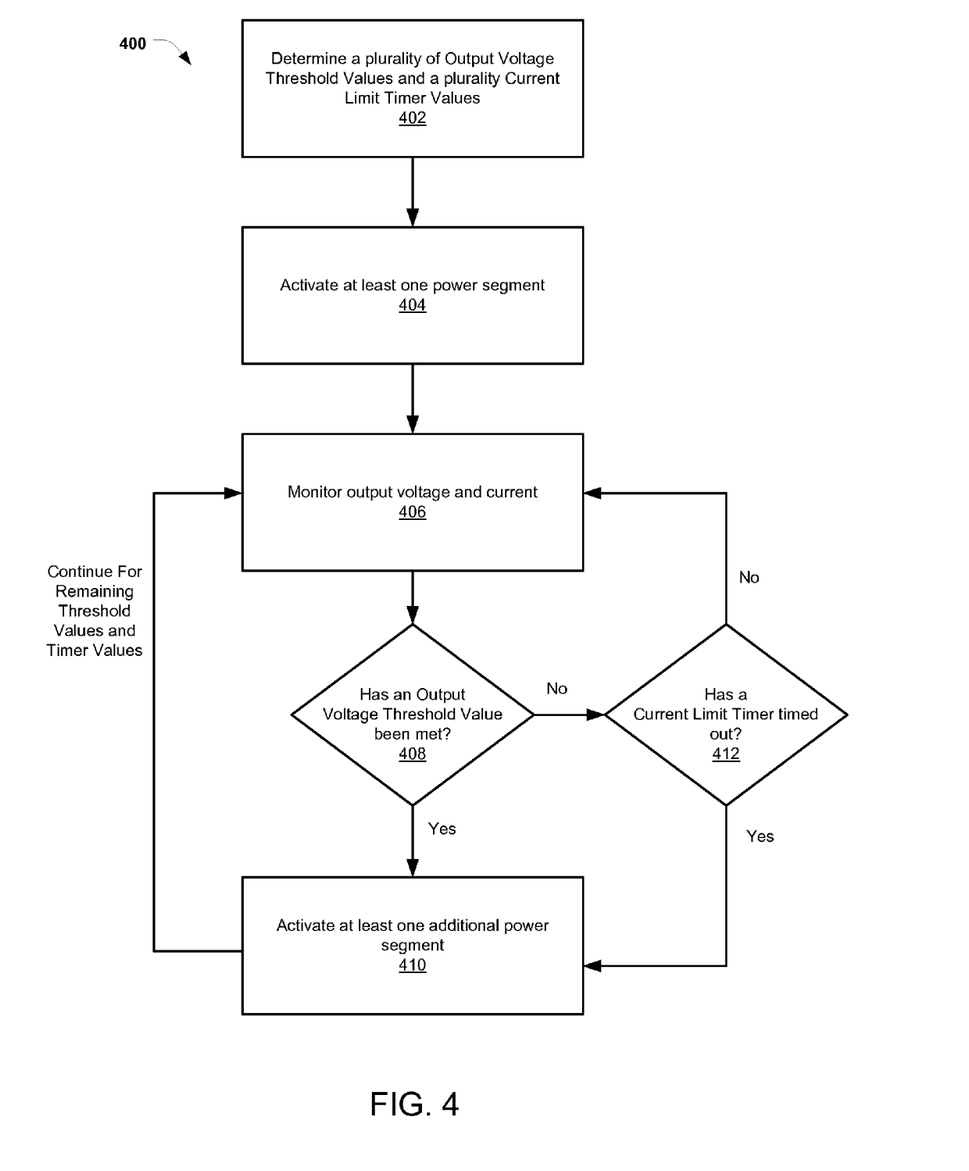
FIG. 4 illustrates a flowchart of operations according to one embodiment of the present disclosure.

FIG. 4 illustrates a flowchart 400 of operations consistent with one embodiment of the present disclosure. Operations of this embodiment may include determining a plurality of output voltage threshold values and a plurality of current limit timer values 402. Operations may also include activating at least one power segment 404. Operations of this embodiment may also include monitoring output voltage and current 406. Operations may further include determining if an output voltage threshold value has been met 408, by comparing the output voltage to an output voltage threshold value. If the output voltage is equal to an output voltage threshold value, operations may further include activating at least one additional power segment 410. If the output voltage remains below an output voltage threshold value, operations may further include determining if a current limit timer value has timed out 412, by determining if the output current has reached a selected current threshold value and started a current limit timer. If an output voltage threshold value has not been met and a current limit timer has timed out, operations may further include activating at least one additional power segment 410. Once an additional power segment is activated, operations 406, 408, 410 and/or 412 may continue for the remaining threshold values and timer values.

Figure 5:
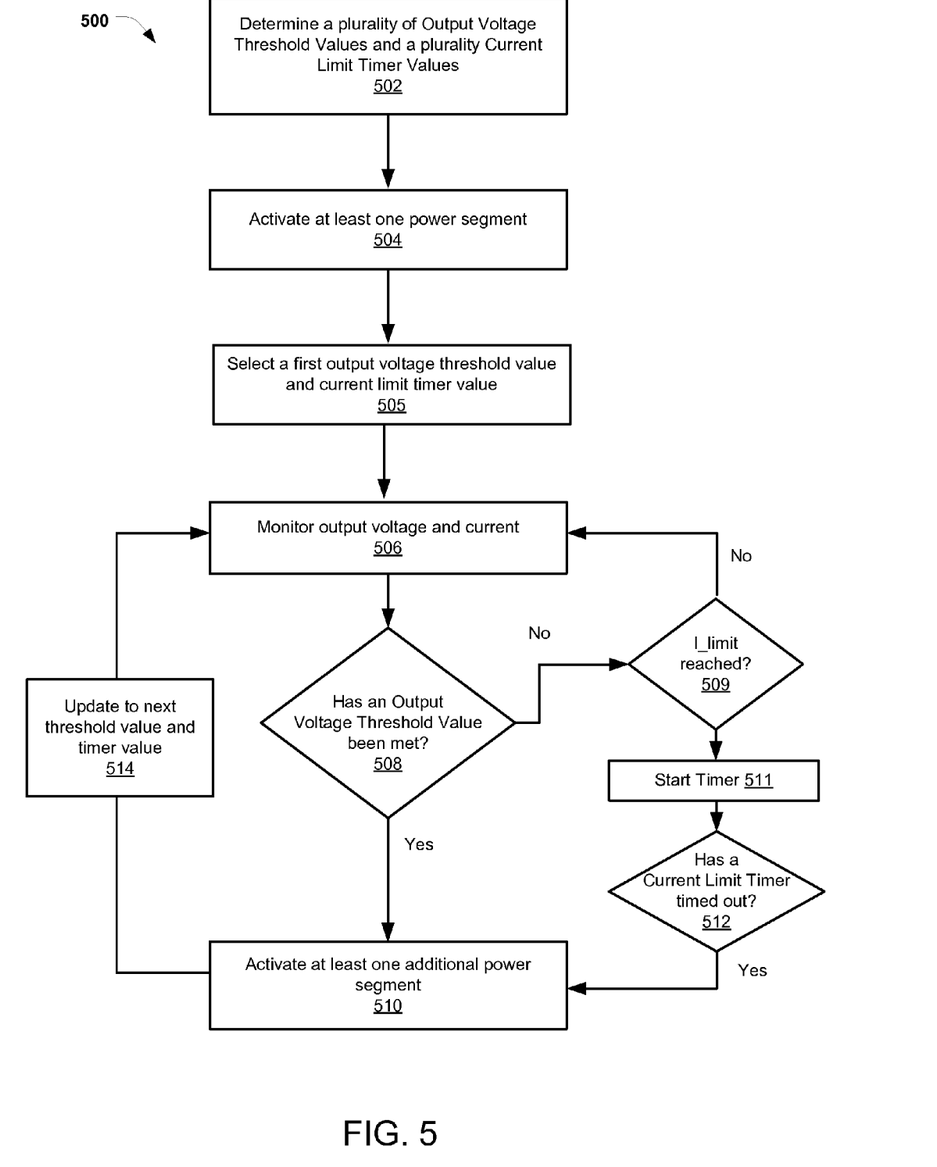
FIG. 5 illustrates a flowchart of operations according to another embodiment of the present disclosure.

FIG. 5 illustrates a flowchart 400 of operations consistent with another embodiment of the present disclosure. Operations of this embodiment may include determining a plurality of output voltage threshold values and a plurality of current limit timer values 502. Operations may also include activating at least one power segment 504. Operations may also include selecting a first output voltage threshold value and current limit timer value 505. Operations of this embodiment may also include monitoring output voltage and current 506. Operations may further include determining if an output voltage threshold value has been met 508, by comparing the output voltage to an output voltage threshold value. If the output voltage is equal to an output voltage threshold value, operations may further include activating at least one additional power segment 510. If the output voltage remains below an output voltage threshold value, operations may further include determining if a current limit has been reached 509 and, if so, starting a current limit timer 511. When the current limit timer times out 512, operations may further include activating at least one additional power segment 510. Once an additional power segment is activated, the next threshold value and timer value is selected 514, and monitoring is continued 506.

While FIGS. 4 and 5 illustrate various operations according to one embodiment, it is to be understood that not all of these operations are necessary. Indeed, it is fully contemplated herein that in other embodiments of the present disclosure, the operations depicted in FIGS. 4 and 5 may be combined in a manner not specifically shown in any of the drawings, but still fully consistent with the present disclosure. Thus, claims directed to features and/or operations that are not exactly shown in one drawing are deemed within the scope and content of the present disclosure. In addition, "circuitry" or "circuit," as used in any embodiment herein, may comprise, for example, singly or in any combination, hardwired circuitry, programmable circuitry, state machine circuitry, and/or circuitry available in a larger system, for example, discrete elements that may be included as part of an integrated circuit. In addition, any of the switch devices described herein may include any type of known or after-developed switch circuitry such as, for example, MOS transistor, BJT, etc. A module, as used in any embodiment herein, may be embodied as circuitry.

Thus the present disclosure provides systems and methods for improved startup for DC-DC converters that reduce input voltage droop, in-rush current and output voltage jumps.

According to one aspect there is provided a system. The system may include a power stage circuitry comprising a plurality of power segments coupled in parallel, the power stage circuitry is coupled between an input voltage and output stage circuitry and configured to deliver power to a load coupled to the output stage circuitry. The system of this example may also include a PWM and power stage controller circuitry configured to sequentially and progressively activate the plurality of power segments to limit an input in-rush current from the input voltage during a ramp up period and output voltage at the output stage circuitry.

According to another aspect there is provided a method. The method may include determining a plurality of output voltage threshold values and a plurality of current limit timer values. The method of this example may also include activating a first power segment of a DC-DC converter. The method of this example may further include monitoring output voltage and current. The method of this example may further include determining if the output voltage equals a first of the output voltage threshold values. The method of this example may further include determining if a first of the current limit timer values has timed out. The method of this example may further include activating a second power segment of the DC-DC converter if the output voltage equals the first output voltage threshold value or if the first current limit timer value has timed out.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Accordingly, the claims are intended to cover all such equivalents. Various features, aspects, and embodiments have been described herein. The features, aspects, and embodiments are susceptible to combination with one another as well as to variation and modification, as will be understood by those having skill in the art. The present disclosure should, therefore, be considered to encompass such combinations, variations, and modifications.

What is claimed is:

1. A DC-DC converter system, comprising:
power stage circuitry comprising a plurality of power segments coupled in parallel, said power stage circuitry is coupled between an input voltage and output stage circuitry and configured to deliver power to a load coupled to said output stage circuitry; and
pulse width modulation (PWM) and power stage controller circuitry configured to sequentially and progressively activate said plurality of power segments to limit an input in-rush current from said input voltage during a ramp up period and output voltage at said output stage circuitry, said PWM and power stage controller circuitry comprising a voltage threshold selection and comparator circuit configured to select an output voltage threshold from a plurality of output voltage thresholds and compare said selected output voltage threshold to said output voltage and to activate one of said power segments associated with said selected output voltage threshold.

2. The system of claim 1, wherein said PWM and power stage controller circuitry further comprises a timer circuit configured to activate one of said power segments in response to a current limit condition existing for one of a plurality of current limit timer values, said current limit timer value associated with said power segment.

3. The system of claim 2, wherein said plurality of output voltage threshold values and said plurality of current limit timer values are pre-determined based on the topology of said DC-DC converter.

4. The system of claim 2, wherein said plurality of output voltage threshold values and said plurality of current limit timer values are programmable.

5. The system of claim 1, wherein said plurality of output voltage threshold are selected in increasing voltage values as said plurality of power segments are sequentially and progressively activated.

6. The system of claim 1, wherein at least two of said progressively activated power segments is on a high-side of said DC-DC converter.

7. The system of claim 1, wherein at least two of said progressively activated power segments is on a low-side of said DC-DC converter.

8. The system of claim 1, wherein said DC-DC converter system is configured as a buck converter topology.

9. The system of claim 1, wherein said DC-DC converter system is configured as a boost converter topology.

10. The system of claim 1, wherein said power segments comprise FET switch circuitry.

11. The system of claim 1, wherein at least one of said power segments comprises diode switch circuitry.

12. A method, comprising:
determining a plurality of output voltage threshold values and a plurality of current limit timer values;
activating a first power segment of a DC-DC converter;
monitoring output voltage and current;
determining if said output voltage equals a first of said output voltage threshold values;
determining if a first of said current limit timer values has timed out; and
activating a second power segment of said DC-DC converter if said output voltage equals said first output voltage threshold value or if said first current limit timer value has timed out.

13. The method of claim 12, further comprising:
determining if said output voltage equals a second of said output voltage threshold values in response to said activating of said second power segment;
determining if a second of said current limit timer values has timed out; and
activating a third power segment of said DC-DC converter if said output voltage equals said second output voltage threshold value or if said second current limit timer value has timed out.

14. The method of claim 12, wherein said first and said second power segments are on a high-side of said DC-DC converter.

15. The method of claim 12, wherein said first and said second power segments are on a low-side of said DC-DC converter and said DC-DC converter is a boost converter.

16. The method of claim 12, wherein said plurality of output voltage threshold values and said plurality of current limit timer values are pre-determined based on the topology of said DC-DC converter.

17. The method of claim 12, wherein said plurality of output voltage threshold values and said plurality of current limit timer values are programmable.

18. The method of claim 13, wherein said second output voltage threshold is greater than said first output voltage threshold.

* * * * *